US011408071B2

(12) United States Patent
Son et al.

(10) Patent No.: US 11,408,071 B2
(45) Date of Patent: Aug. 9, 2022

(54) GAS SUPPLYING UNIT OF SUBSTRATE TREATING APPARATUS

(71) Applicant: SEMES CO., LTD., Cheonan-si (KR)

(72) Inventors: Hyoung Kyu Son, Seoul (KR); Jin Hyun Lee, Yongin-si (KR)

(73) Assignee: SEMES CO., LTD., Cheonan-si (KR)

( * ) Notice: Subject to any disclaimer, the term of this patent is extended or adjusted under 35 U.S.C. 154(b) by 90 days.

(21) Appl. No.: 16/802,559

(22) Filed: Feb. 27, 2020

(65) Prior Publication Data

US 2020/0277702 A1 Sep. 3, 2020

(30) Foreign Application Priority Data

Feb. 28, 2019 (KR) ........................ 10-2019-0023804

(51) Int. Cl.
*C23C 16/40* (2006.01)
*C23C 16/455* (2006.01)
*C23C 16/458* (2006.01)

(52) U.S. Cl.
CPC .... *C23C 16/45565* (2013.01); *C23C 16/4557* (2013.01); *C23C 16/4582* (2013.01)

(58) Field of Classification Search
CPC .......... C23C 16/45565; C23C 16/4557; C23C 16/4582; H01L 21/67017; H01L 21/67069; H01L 21/67109; H01L 21/67098; H01L 21/02
USPC ........................ 118/715; 156/345.33, 345.34
See application file for complete search history.

(56) References Cited

U.S. PATENT DOCUMENTS

| 7,862,682 B2 | 1/2011 | Stevenson et al. |
| 8,216,418 B2 | 7/2012 | Patrick et al. |
| 2003/0209323 A1* | 11/2003 | Yokogaki .......... C23C 16/45565 |
| | | 156/345.34 |
| 2006/0266852 A1* | 11/2006 | Choi .................. H01J 37/3244 |
| | | 239/548 |
| 2009/0095424 A1* | 4/2009 | Bettencourt ............ H01J 37/04 |
| | | 156/345.34 |

FOREIGN PATENT DOCUMENTS

| KR | 10-2010-0039835 A | 4/2010 |
| KR | 10-2010-0048991 A | 5/2010 |
| KR | 10-2011-0049800 | 5/2011 |
| WO | 2010-019197 | 2/2010 |

* cited by examiner

*Primary Examiner* — Rudy Zervigon

(57) ABSTRACT

A gas supplying unit of a substrate treating apparatus is proposed. The gas supplying unit includes: a gas distribution plate having a first surface and a second surface opposite the first surface, and having first gas supply holes formed through the first surface and the second surface; a shower head having a third surface being in close contact with the second surface and a fourth surface opposite the third surface, and having second gas supply holes formed through the third surface and the fourth surface to be connected to the first gas supply holes; and heat transfer members having first ends inserted in at least one of the gas distribution plate and the shower head and second ends being in contact with any one of the shower head and the gas distribution plate.

24 Claims, 9 Drawing Sheets

GAS SUPPLYING UNIT OF SUBSTRATE TREATING APPARATUS

CROSS REFERENCE TO RELATED APPLICATION

The present application claims priority to Korean Patent Application No. 10-2019-0023804, filed Feb. 28, 2019, the entire contents of which is incorporated by reference herein for all purposes.

BACKGROUND OF THE INVENTION

Field of the Invention

The present invention relates to a substrate treating apparatus and, more particularly, to a gas supplying unit of a substrate treating apparatus.

Description of the Related Art

Various processes such as photographing, etching, thin film deposition, ion injection, and cleaning are performed to manufacture a semiconductor device. A substrate treating apparatus that uses a process gas is used in the etching, thin film deposition, and cleaning of the processes.

The process gas should be uniformly supplied to the entire area of a substrate and may be supplied through a gas supplying unit for uniform supply to each region.

The gas supplying unit is usually provided in a structure in which a plurality of plates is stacked up and down.

For example, as shown in FIG. 1, a gas supplying unit according to the related art includes a gas distribution plate 10 and a shower head 20 stacked and coupled by bolts B, in which a process gas is discharged to a substrate through discharge holes 11 and 21 formed in the gas distribution plate 10 and the shower head 20.

That is, a substrate is put into a chamber, a process gas is supplied with a predetermined flow rate into the chamber in a vacuum atmosphere through the gas distribution plate 10 and the shower head 20, whereby the substrate can be treated by the process gas.

However, according to the related art shown in FIG. 1, heat may not transfer well between the gas distribution plate 10 and the shower head 20 due to reasons such as manufacturing tolerance between the gas distribution plate 10 and the shower head 20, deformation by long-time use in a vacuum atmosphere, and a difference in coefficient of thermal expansion.

Accordingly, as the process progresses, the temperature of the shower head rapidly increases, and in this case, various problems such as process uniformity may be caused.

In order to solve these problems, a configuration in which a heat transfer pad 30 is disposed between the gas distribution plate 10 and the shower head 20, as shown in FIG. 2, has been disclosed.

However, according to this configuration, since the gas distribution plate 10 and the shower head 20 are spaced by the heat transfer pad 30, so the heat transfer pad 30 is exposed to the process gas supplied through the discharge holes 11. Accordingly, as the process progresses, a chemical reaction occurs between the process gas and the heat transfer pad 30, which may be a reason that causes particles. Further, when a substrate is treated in a plasma state, plasma discharge may locally occur in a spaced space S, and the process gas may remain in the spaced space S without being purged, which may influence following processes.

DOCUMENTS OF RELATED ART (Patent Document 1) Korean Patent Application Publication No. 10-2011-0049800

SUMMARY OF THE INVENTION

The present invention provides a gas supplying unit of a substrate treating apparatus, the gas supplying unit quickly transferring heat of a shower head to a gas distribution plate.

The present invention provides a gas supplying unit of a substrate treating apparatus, the gas supplying unit being able to uniformly supply a process gas to the entire region of a substrate.

The objects of the present invention are not limited thereto, and other objects and advantages of the present invention will be understood from the following description.

A gas supplying unit of a substrate treating apparatus according to an embodiment of the present invention includes: a gas distribution plate having a first surface and a second surface opposite the first surface, and having first gas supply holes formed through the first surface and the second surface; a shower head having a third surface being in close contact with the second surface and a fourth surface opposite the third surface, and having second gas supply holes formed through the third surface and the fourth surface to be connected to the first gas supply holes; and heat transfer members having first ends inserted in at least one of the gas distribution plate and the shower head.

In an embodiment, the heat transfer members may have first ends inserted in the gas distribution plate and second ends being in contact with the third surface of the shower head. The first ends of the heat transfer members inserted in the gas distribution plate may not be exposed to the first surface of the gas distribution plate.

In an embodiment, the heat transfer members may have first ends being in contact with the second surface of the gas distribution plate and second ends inserted in the shower head. Lengths of the heat transfer members may be smaller than thickness of the shower head.

In an embodiment of the present invention, the heat transfer members may be disposed through the gas distribution plate with first ends having the same phase as the first surface of the gas distribution plate and second ends being in contact with the shower head or partially inserted in the shower head. Caps may be disposed at upper ends of the heat transfer members, so the first ends of the heat transfer members may not be exposed.

In an embodiment of the present invention, cores having higher thermal conductivity than thermal conductivity of the heat transfer members may be disposed in the heat transfer members.

In an embodiment of the present invention, a plurality of distribution spaces having different diameters may be disposed on the first surface of the gas distribution plate around a center of the gas distribution plate, and the first gas supply holes may be formed in the distribution spaces. The heat transfer members may be disposed between the distribution spaces. Gaps between the distribution spaces may be 1~30 mm.

In an embodiment of the present invention, the heat transfer members may be made of a silicon-based composite, low-molecular weight siloxane, a uniformly distributed thermal conductive filler, or a combination thereof.

In an embodiment of the present invention, diameters of the heat transfer members may decrease toward an edge from a center of the shower head, or the heat transfer members may be concentrated toward the center of the head.

In an embodiment of the present invention, a substrate treating apparatus including the gas supplying unit is disclosed.

According to an embodiment of the present invention, since heat transfer members are inserted in the gas distribution plate and the shower head, heat of the shower head can transfer to the gas distribution plate through the heat transfer members when the temperature of the shower head rapidly increases, which may occur during a process. Accordingly, it is possible to improve process uniformity in a substrate treating process.

Further, according to an embodiment of the present invention, since the gas distribution plate and the shower head are in close contact with each other without a gap, it is possible to prevent a process gas from reacting with the heat transfer members and it is also possible to prevent the possibility that plasma discharge is locally generated in a spaced space or a process gas remains without being purged.

The effects of the present invention are not limited thereto and it should be understood that the effects include all effects that can be inferred from the configuration of the present invention described in the following specification or claims.

BRIEF DESCRIPTION OF THE DRAWINGS

The following drawings attached to the specification exemplify embodiments of the present invention and further held understand the spirit of the present invention with the following detailed description. Accordingly, the present invention should not be construed as being limited to the configurations shown in the drawings.

DETAILED DESCRIPTION OF THE INVENTION

Figure 1:
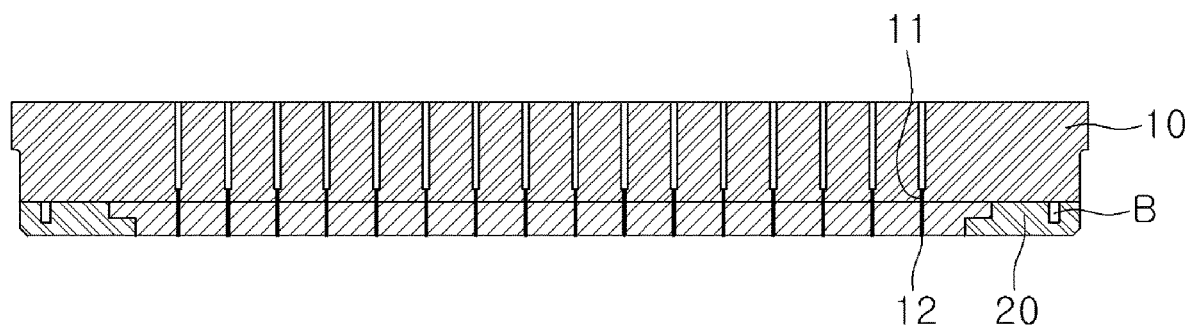
FIG. 1 is a view showing an example of a gas supplying unit of a substrate treating apparatus according to the related art.
Figure 2:
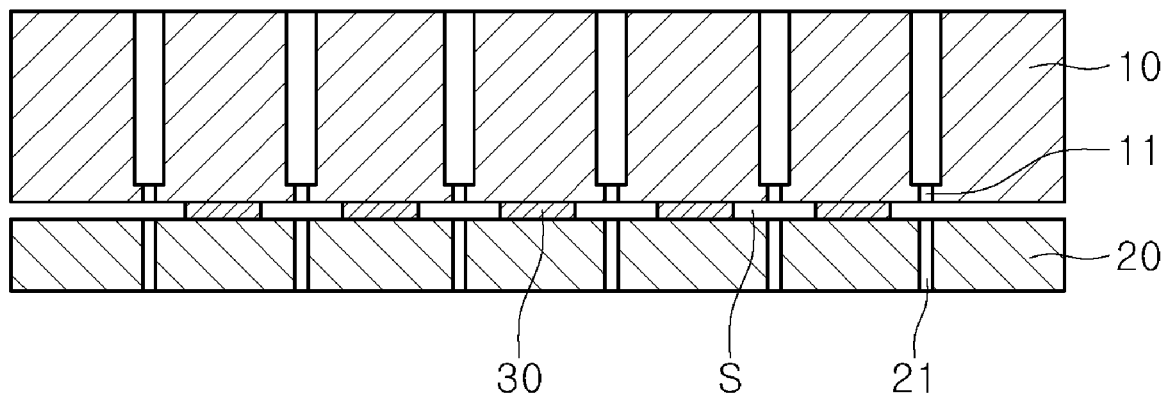
FIG. 2 is a view showing another example of the gas supplying unit of a substrate treating apparatus according to the related art.

Hereafter, embodiments of the present invention are described in detail with reference to the accompanying drawings. The present invention can be implemented in various different ways and is not limited to the embodiments described herein.

Detailed description of configurations not related to the spirit of the present invention may be omitted to clearly describe the present invention, and the same or similar components may be given the same reference numeral throughout the specification.

Further, unless explicitly described otherwise, "comprising" any components will be understood to imply the inclusion of other components rather than the exclusion of any other components. Terms used herein are provided only to state specific embodiments and are not intended to limit the present invention, and may be construed as conception understood by those skilled in the art unless defined otherwise herein.

Figure 3:
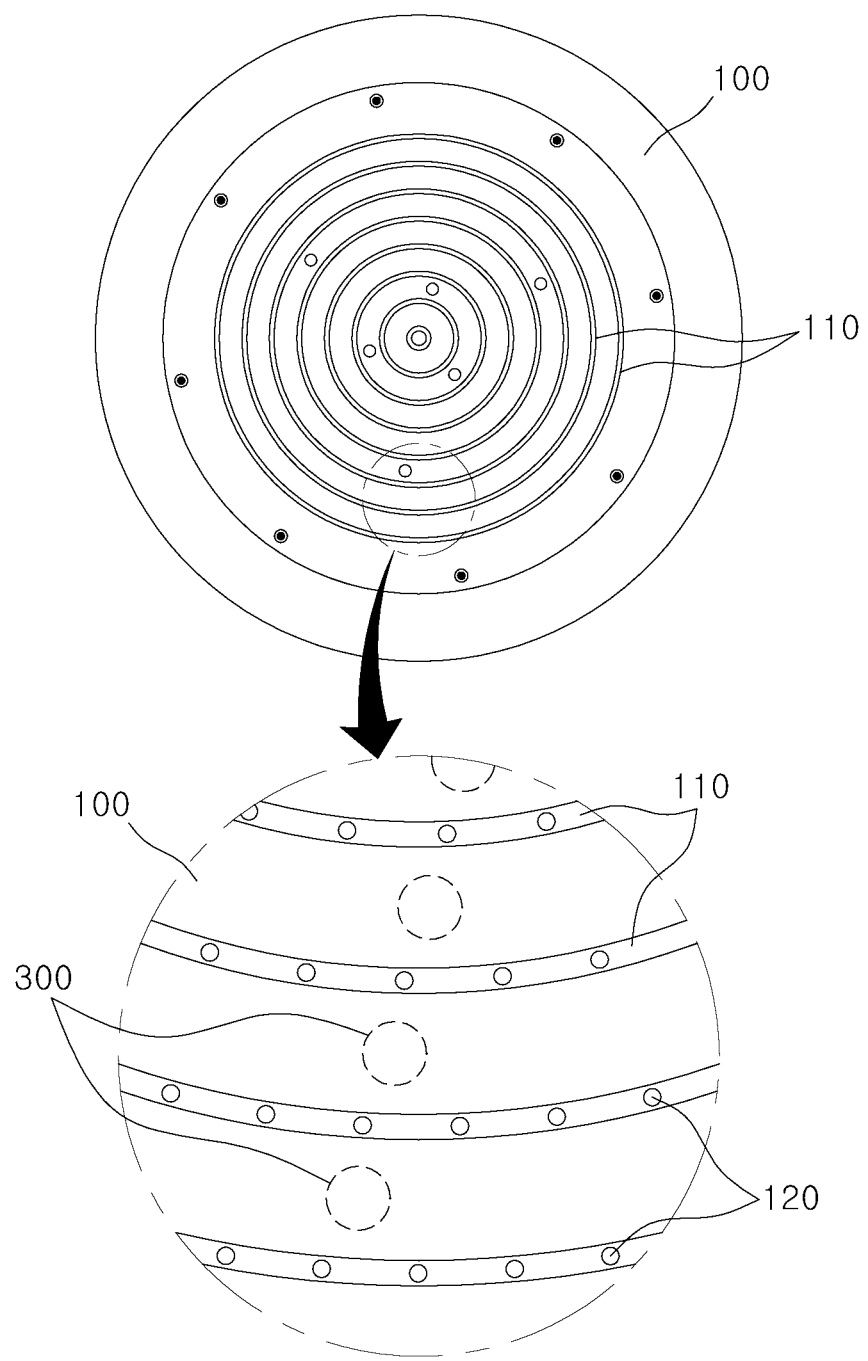
FIG. 3 is a plan view of a gas supplying unit of a substrate treating apparatus according to a first embodiment of the present invention.
Figure 4:
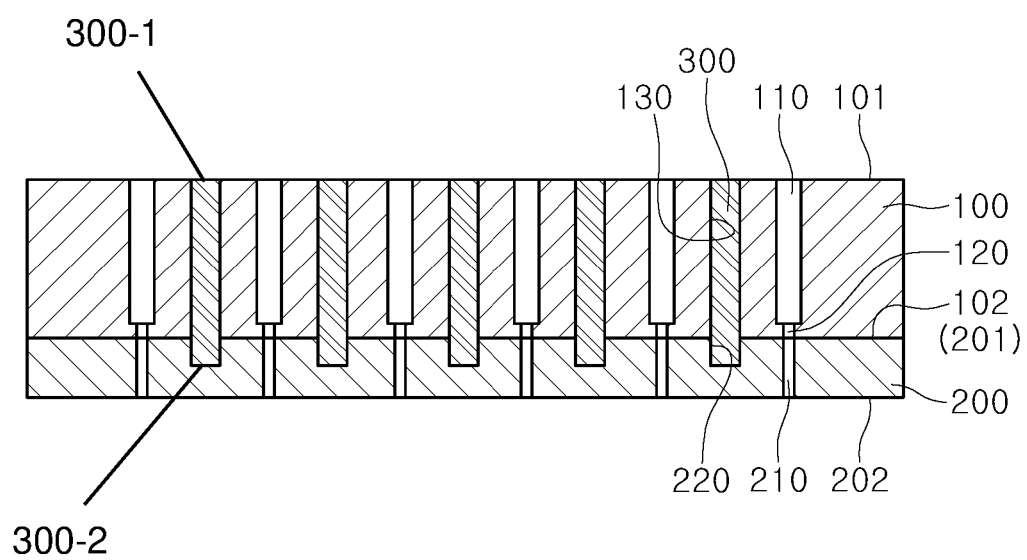
FIG. 4 is a cross-sectional view of the gas supplying unit of a substrate treating apparatus according to the first embodiment of the present invention.

FIGS. 3 and 4 are views of the gas supplying unit of a substrate treating apparatus according to the first embodiment of the present invention.

Referring to FIGS. 3 and 4, a gas supplying unit of a substrate treating apparatus includes a gas distribution plate 100 and a shower head 200 coupled to the bottom of the gas distribution plate 100.

The gas distribution plate 100 may be formed in a disc shape having a first surface 101 and a second surface 102 opposite the first surface 101. A plurality of distribution spaces 110 having different diameters is coaxially disposed on the first surface 101 around the center of the gas distribution plate 100. The second surface 102 of the gas distribution plate 100 may be a surface being in close contact with the shower head 200. In an exemplary embodiment, each of the plurality of distribution spaces 110 may be shaped of an annular ring. The plurality of distribution spaces may be positioned at different radii of the gas distribution plate 100. In an exemplary embodiment, the gas distribution plate 100 and the plurality of distribution spaces 110 may be concentric.

The distribution spaces 110 may be formed in groove shapes recessed from the first surface 101 of the gas distribution plate 100 toward the second surface 102 thereof. The gaps between the distribution spaces 110 may be between 1 mm and 30 mm. The gaps between the distribution spaces 110 may or may not be the same.

A plurality of first gas supply holes 120 may be connected to the plurality of distribution spaces 110. For example, at least one first gas supply hole 120 may be connected to a corresponding one of the plurality of distribution spaces 110. For example, each of the plurality of first gas supply holes 120 may penetrate the gas distribution plate 100 from a bottom surface of a corresponding one of the plurality of distribution spaces 110 to the second surface 102 of the gas distribution plate 100. The first gas supply holes 120 are used to supply a process gas, which has been supplied in the distribution spaces 110, to the shower head 200.

The gas distribution plate 100 has a plurality of through-holes 130. The through-holes 130 may be formed through the first surface 101 and the second surface 102 of the gas distribution plate 100 at positions where they do not interfere with the first gas supply holes 120. For example, the through-holes 130 may be formed between the distribution spaces 110. Heat transfer members 300 for transferring heat between the shower head 200 and the gas distribution plate 100 are inserted in the through-holes 130.

The shower head 200 may be formed in a disc shape having a third surface 201 and a fourth surface 202 opposite the third surface 201. The third surface 201 of the shower head 200 is in close contact with the second surface 102 of the gas distribution plate 100 and the fourth surface 202 may be a surface that faces a substrate with a predetermined gap therebetween.

The shower head 200 has second gas supply holes 210. The second gas supply holes 210 are formed through the third surface 201 and the fourth surface 202. The number and positions of the second gas supply holes 210 correspond to those of the first gas supply holes 120. That is, the second gas supply holes 210 are arranged at positions where they communicate with the first gas supply holes 120 of the gas distribution plate 100. For example, each of the second gas supply holes 210 may be connected to a corresponding one of the first gas supply holes 120.

The shower head 200 may have first insertion grooves 220. The first insertion grooves 220 are recessed downward on the third surface 201. The number and positions of the first insertion grooves 220 of the shower head 200 may correspond to those of the through-holes 130 of the gas distribution plate 100. Heat transfer members 300 for transferring heat between the shower head 200 and the gas distribution plate 100 are inserted in the first insertion grooves 220.

The heat transfer members 300 provide a thermal conductive interface between the shower head 200 and the gas distribution plate 100. The heat transfer members 300 may be inserted in the through-holes 130 of the gas distribution plate 100 and the first insertion grooves 220 of the shower head 200.

That is, the heat transfer members 300 may be disposed through the gas distribution plate 100. In an exemplary embodiment, the gas distribution plate 100 may include first ends 300-1 coplanar with the first surface 101 of the gas distribution plate 100, and second ends 300-2 partially inserted in the first insertion grooves 220 of the shower head 200.

Elastic members having predetermined elasticity may be applied as the heat transfer members 300. When the heat transfer members 300 are made of a non-elastic material, the difference in thermal conductivity between the gas distribution plate 100 and the shower head 200 is never absorbed, so the gas distribution plate 100, the shower head 200, or the heat transfer members 300 may be damaged or deformed due to thermal expansion.

For example, the heat transfer members 300 may include a silicone-based composite, low-molecular weight siloxane, a uniformly distributed thermal conductive filler, or a combination thereof.

The heat transfer members 300 may be made of a polymer material that is stable in a vacuum environment and has resistance to thermal decomposition at high temperature. Polymer materials that can be used in a high-temperature environment include polyimide, poly-ketone, polyether-ketone, polyether sulfone, polyethylene terephthalate, fluoroethylene, propylene copolymer, cellulose, triacetate, and silicone.

The shapes of the heat transfer members 300 do not need to be specifically limited. For example, the heat transfer members 300 may be formed in a cylindrical shape having a circular cross-section or a poly prismatic shape having a polygonal cross-section.

According to the embodiment of the present invention, the heat transfer members 300 are inserted in the shower head 200 and the gas distribution plate 100 while bringing the shower head 200 and the gas distribution plate 100 in close contact with each other rather than disposing a heat transfer substance in a pad type between the shower head 200 and the gas distribution plate 100.

Accordingly, even if the gas distribution plate 100 and the shower head 200 have different coefficients of thermal expansion, heat of the shower head 200 transfers to the gas distribution plate 100 through the heat transfer members 300 during a process, thereby being able to suppress an excessive increase in temperature of the shower head 200. Further, the gas distribution plate 100 and the shower head 200 are in close contact with each other without a space therebetween, whereby it is possible to solve the problem with particles that may be generated due to exposure of the heat transfer members 300 to a process gas.

Figure 5:
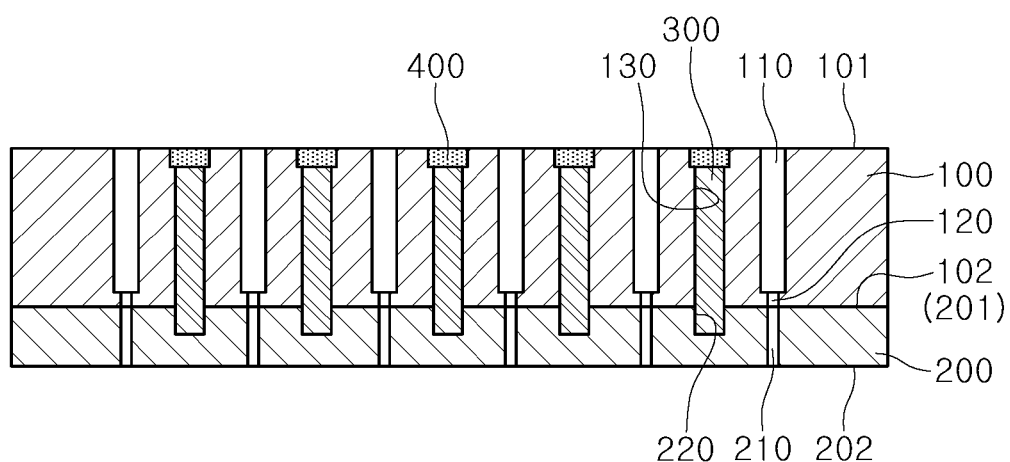
FIG. 5 is a cross-sectional view of a gas supplying unit of a substrate treating apparatus according to a second embodiment of the present invention.

FIG. 5 is a view showing a gas supplying unit of a substrate treating apparatus according to a second embodiment of the present invention.

According to the first embodiment, the upper ends of the heat transfer members 300 may be exposed through the first surface 101 of the gas distribution plate 100. When the upper ends of the heat transfer members 300 are exposed in this way, the heat transfer members 300 may chemically react with a process gas that is supplied to the gas distribution plate 100.

Accordingly, in the second embodiment, caps 400 may be disposed on the upper ends of the heat transfer members 300, as shown in FIG. 5. The caps 400 may be made of a material that does not generate a chemical reaction with the process gas, for example, synthetic resin.

Accordingly, exposure of the heat transfer members 300 to the first surface 101 of the gas distribution plate 100 is prevented by the caps 400, and accordingly, reaction of the heat transfer members 300 with the process gas can be prevented.

Figure 6:
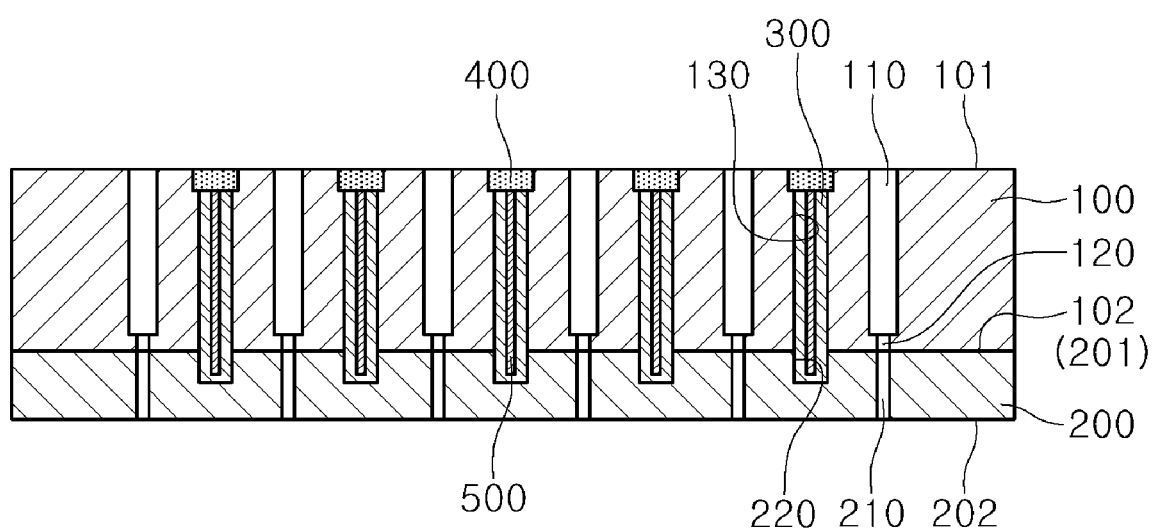
FIG. 6 is a cross-sectional view of a gas supplying unit of a substrate treating apparatus according to a third embodiment of the present invention.

FIG. 6 is a view showing a gas supplying unit of a substrate treating apparatus according to a third embodiment of the present invention.

Referring to FIG. 6, cores 500 may be disposed in the heat transfer members 300. That is, the heat transfer members 300 are formed in hollow tube shapes and the cores 500 are inserted in the heat transfer members 300. The cores 500 may be a substance having thermal conductivity higher than that of the heat transfer members 300. For example, the cores 500 may be metal or ceramic.

Since the cores 500 having relatively high thermal conductivity are inserted in the heat transfer members 300, heat of the shower head can more quickly transfer to the gas distribution plate 100.

Further, since the heat transfer members 300 are made of an elastic material, the cores 500 can be made of a material having sufficient strength. Accordingly, it is possible to absorb the difference of thermal expansion between the gas distribution plate 100 and the shower head 200 and it is also possible to achieve higher thermal conductivity. Further, the cores 500 can support the heat transfer members 300 in the heat transfer members 300.

Figure 7:
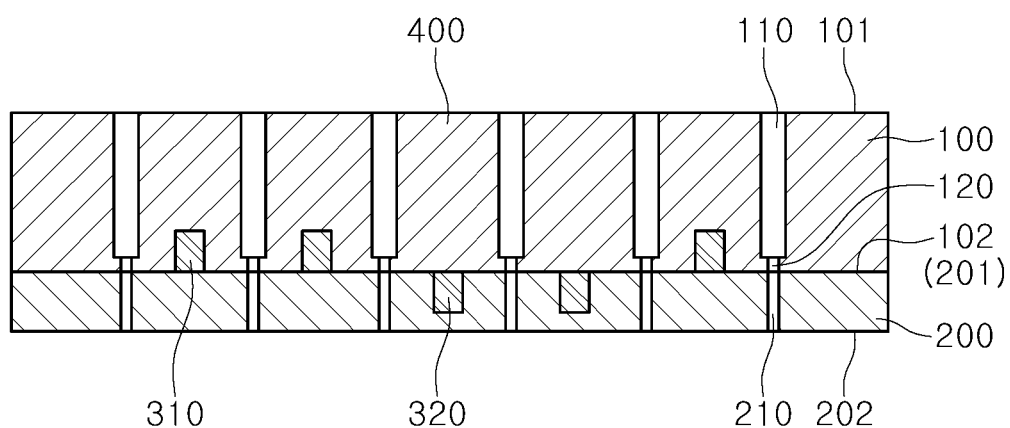
FIG. 7 is a cross-sectional view of a gas supplying unit of a substrate treating apparatus according to a fourth embodiment of the present invention.

FIG. 7 is a view showing a gas supplying unit of a substrate treating apparatus according to a fourth embodiment of the present invention.

Referring to FIG. 7, heat transfer members 310 and 320 may be inserted in at least one of the gas distribution plate 100 and the shower head 200.

For example, first ends of the heat transfer members 310 are inserted in the gas distribution plate 100 and second ends are exposed to the second surface 102 of the gas distribution plate 100. Accordingly, the second ends of the heat transfer members 310 are exposed from the second surface 102 of the gas distribution plate 100 and are in contact with the third surface 201 of the shower head 200, the heat of the shower head 200 can transfer to the gas distribution plate 100. The lengths (heights) of the heat transfer members 310 may be smaller than the thickness of the gas distribution plate 100.

In detail, the gas distribution plate 100 has second insertion grooves 140. The second insertion grooves 140 are recessed upward on the second surface 102 of the gas distribution plate 100. The first ends of the heat transfer members 310 for transferring heat between the shower head 200 and the gas distribution plate 100 are inserted in the second insertion grooves 140.

Alternatively, the first ends of the heat transfer members 320 are in contact with the second surface 102 of the gas distribution plate 100 and the second ends thereof are inserted in the shower head 200. Accordingly, the second ends of the heat transfer members 320 are exposed from the third surface 201 of the shower head 200 and are in contact with the gas distribution plate 100, so the heat of the shower head 200 can transfer to the gas distribution plate 100. The lengths (heights) of the heat transfer members 320 may be smaller than the thickness of the shower head 200.

In detail, the shower head 200 has first insertion grooves 220. The first insertion grooves 220 are recessed downward on the third surface 201 of the shower head 200. The second ends of the heat transfer members 320 for transferring heat between the shower head 200 and the gas distribution plate 100 are inserted in the first insertion grooves 220.

Although both of the first insertion grooves 220 and the second insertion grooves 140 are provided in FIG. 7, any one of the first insertion grooves 220 and the second insertion grooves 140 may be provided. That is, heat transfer members may be provided to be inserted only in any one of the gas distribution plate 100 and the shower head 200 and to be in contact with the other one.

Figure 8:
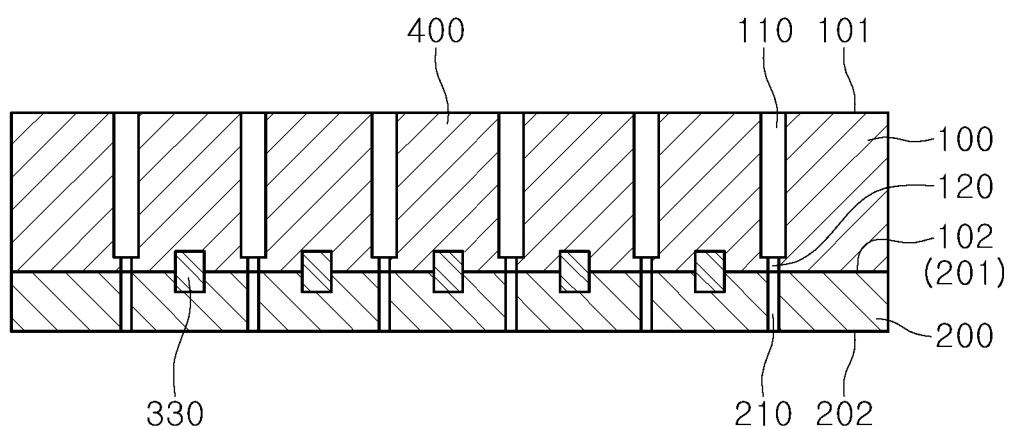
FIG. 8 is a cross-sectional view of a gas supplying unit of a substrate treating apparatus according to a fifth embodiment of the present invention.

FIG. 8 is a view showing a gas supplying unit of a substrate treating apparatus according to a fifth embodiment of the present invention.

Referring to FIG. 8, both ends of heat transfer members 330 may be inserted in the gas distribution plate 100 and the shower head 200, respectively.

That is, the first ends of the heat transfer members 330 are inserted in the gas distribution plate 100 and the second ends thereof are inserted in the shower head 200.

In detail, the gas distribution plate 100 has second insertion grooves 140. The second insertion grooves 140 are recessed upward on the second surface 102 of the gas distribution plate 100. The first ends of the heat transfer members 330 are inserted in the second insertion grooves 140.

Further, the shower head 200 has first insertion grooves 220. The first insertion grooves 220 are recessed downward on the third surface 201 of the shower head 200. The second ends of the heat transfer members 330 are inserted in the first insertion grooves 220.

Accordingly, the heat transfer members 330 can transfer heat of the shower head 200 to the gas distribution plate 100 in a state in which they are inserted in the gas distribution plate 100 and the shower head 200 without being exposed to the outside.

Figure 9:
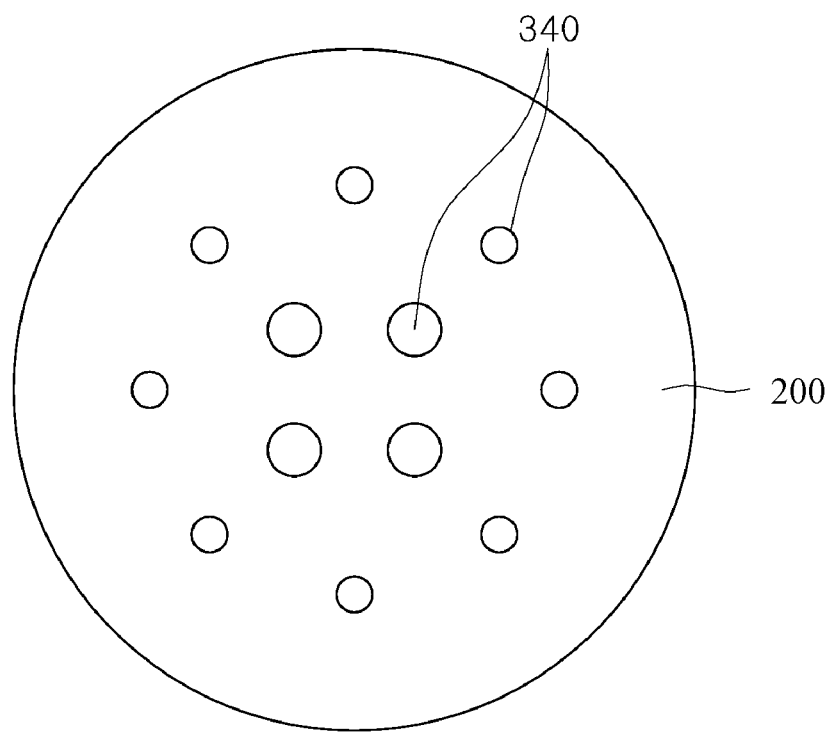
FIG. 9 is a bottom view of a gas supplying unit of a substrate treating apparatus according to a sixth embodiment of the present invention.

FIG. 9 is a bottom view showing a gas supplying unit of a substrate treating apparatus according to a sixth embodiment of the present invention.

The shower head 200 can be heated to different degrees, depending on positions during a process. For example, plasma may concentrate at the center portion of the shower head 200 during a process in a plasma state. In this case, the center portion may be heated to higher temperature than the edge in the shower head 200, which may cause deterioration of process uniformity. Accordingly, it may be possible to vary the heat transfer characteristic in accordance with the position of the shower head 200 in order to improve process uniformity.

Accordingly, the heat transfer members 340 may have different diameters. That is, the heat transfer members 340, as shown in FIG. 9, may gradually increase in diameter as they go from the edge to the center portion of the shower head 200.

Since the diameters of the heat transfer members 340 are increased toward the center portion of the shower head 200, heat can quickly transfer to the gas distribution plate 100 at the center portion of the shower head 200 at which plasma is concentrated more than at the edge. Accordingly, uniform process treatment is generally possible.

The present invention can be achieved in detail without changing the spirit or the necessary features of the present invention by those skilled in the art, so the embodiments described above should be understood as being example without limiting the present invention in all terms.

The scope of the present invention is defined by the following claims rather than the above detailed description, and all of changes and modifications obtained from the meaning and range of claims and equivalent concepts should be construed as being included in the scope of the present invention.

What is claimed is:

1. A gas supplying unit of a substrate treating apparatus, the gas supplying unit comprising:
   a gas distribution plate having a first surface and a second surface opposite the first surface, and having first gas supply holes formed between the first surface and the second surface;
   a shower head having a third surface being in direct contact with the second surface and a fourth surface opposite the third surface, and having second gas supply holes formed through the third surface and the fourth surface to be connected to the first gas supply holes; and
   heat transfer members inserted in at least one of the gas distribution plate and the shower head,
   wherein the heat transfer members are made of a silicon-based composite, low-molecular weight siloxane, a uniformly distributed thermal conductive filler, or a combination thereof.

2. The gas supplying unit of claim 1,
   wherein the heat transfer members have first ends inserted in the gas distribution plate and second ends being in contact with the third surface of the shower head.

3. The gas supplying unit of claim 2,
   wherein the first ends of the heat transfer members inserted in the gas distribution plate are not exposed to the first surface of the gas distribution plate.

4. The gas supplying unit of claim 1, wherein the heat transfer members have first ends being in contact with the second surface of the gas distribution plate and second ends inserted in the shower head.

5. The gas supplying unit of claim 4, wherein lengths of the heat transfer members are smaller than a thickness of the shower head.

6. The gas supplying unit of claim 1,
   wherein the heat transfer members are disposed through the gas distribution plate with first ends being coplanar with the first surface of the gas distribution plate and second ends being in contact with the shower head or inserted in the shower head.

7. The gas supplying unit of claim 1, further comprising:
caps are disposed on the heat transfer members,
wherein the heat transfer members include first ends and second ends lower than the first ends, and
wherein the first ends of the heat transfer members are covered with the caps, respectively.

8. The gas supplying unit of claim 1, further comprising:
cores being formed of a material having higher thermal conductivity than thermal conductivity of a material of the heat transfer members,
wherein the cores are disposed in a respective one of the heat transfer members.

9. The gas supplying unit of claim 1,
wherein a plurality of distribution spaces having different diameters is disposed on the first surface of the gas distribution plate around a center of the gas distribution plate, and the first gas supply holes are formed in the distribution spaces.

10. The gas supplying unit of claim 9,
wherein the heat transfer members are disposed between the distribution spaces.

11. The gas supplying unit of claim 9,
wherein gaps between the distribution spaces are between 1 mm and 30 mm.

12. The gas supplying unit of claim 1, wherein diameters of the heat transfer members decrease toward an edge from a center of the shower head.

13. A substrate treating apparatus comprising a gas supplying unit, wherein the gas supplying unit includes:
a gas distribution plate having a first surface and a second surface opposite the first surface, and having first gas supply holes formed between the first surface and the second surface;
a shower head having a third surface being in direct contact with the second surface and a fourth surface opposite the third surface, and having second gas supply holes formed through the third surface and the fourth surface to be connected to the first gas supply holes; and
heat transfer members inserted in at least one of the gas distribution plate and the shower head,
wherein the heat transfer members are made of a silicon-based composite, low-molecular weight siloxane, a uniformly distributed thermal conductive filler, or a combination thereof.

14. The substrate treating apparatus of claim 13,
wherein the heat transfer members have first ends inserted in the gas distribution plate and second ends being in contact with the third surface of the shower head.

15. The substrate treating apparatus of claim 14,
wherein the first ends of the heat transfer members inserted in the gas distribution plate are not exposed to the first surface of the gas distribution plate.

16. The substrate treating apparatus of claim 13,
wherein the heat transfer members have first ends being in contact with the second surface of the gas distribution plate and second ends inserted in the shower head.

17. The substrate treating apparatus of claim 16,
wherein lengths of the heat transfer members are smaller than a thickness of the shower head.

18. The substrate treating apparatus of claim 13,
wherein the heat transfer members are disposed through the gas distribution plate with first ends being coplanar with the first surface of the gas distribution plate and second ends being in contact with the shower head or inserted in the shower head.

19. The substrate treating apparatus of claim 13,
wherein the gas supplying unit further includes:
caps are disposed on the heat transfer members,
wherein the heat transfer members include first ends and second ends lower than the first ends, and
wherein the first ends of the heat transfer members are covered with the caps, respectively.

20. The substrate treating apparatus of claim 13,
wherein the gas supplying unit further includes:
cores being formed of a material having higher thermal conductivity than thermal conductivity of a material of the heat transfer members,
wherein the cores are disposed in a respective one of the heat transfer members.

21. The substrate treating apparatus of claim 13,
wherein a plurality of distribution spaces having different diameters is disposed on the first surface of the gas distribution plate around a center of the gas distribution plate, and the first gas supply holes are formed in the distribution spaces.

22. The substrate treating apparatus of claim 21,
wherein the heat transfer members are disposed between the distribution spaces.

23. The substrate treating apparatus of claim 21,
wherein gaps between the distribution spaces are between 1 mm and 30 mm.

24. The substrate treating apparatus of claim 13,
wherein diameters of the heat transfer members decrease toward an edge from a center of the shower head.

* * * * *